(12) United States Patent
Bai et al.

(10) Patent No.: US 10,217,700 B1
(45) Date of Patent: Feb. 26, 2019

(54) LEAD FRAME FOR INTEGRATED CIRCUIT DEVICE HAVING J-LEADS AND GULL WING LEADS

(71) Applicant: NXP USA, INC., Austin, TX (US)

(72) Inventors: Zhigang Bai, Tianjin (CN); Jinzhong Yao, Tianjin (CN); Xingshou Pang, Tianjin (CN); Jun Li, Tianjin (CN); Meng Kong Lye, Shah Alam (MY)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/980,572

(22) Filed: May 15, 2018

(30) Foreign Application Priority Data

Dec. 7, 2017 (CN) .......................... 2017 1 1281209

(51) Int. Cl.
*H01L 23/495* (2006.01)
*H01L 23/31* (2006.01)

(52) U.S. Cl.
CPC .... *H01L 23/49555* (2013.01); *H01L 23/3114* (2013.01); *H01L 23/4952* (2013.01); *H01L 23/49513* (2013.01)

(58) Field of Classification Search
CPC ............. H01L 23/4952; H01L 23/3114; H01L 23/49555; H01L 23/49513
USPC ......................................................... 257/676
See application file for complete search history.

(56) References Cited

U.S. PATENT DOCUMENTS

| 4,801,765 | A | 1/1989 | Moyer et al. |
| 5,406,119 | A | 4/1995 | Numada |
| 5,594,234 | A | 1/1997 | Carter, Jr. et al. |
| 6,674,154 | B2 | 1/2004 | Minamio et al. |
| 7,211,471 | B1 | 5/2007 | Foster |
| 8,525,311 | B2 * | 9/2013 | Bai .................... H01L 23/49558 257/666 |
| 8,859,339 | B2 | 10/2014 | Bai et al. |
| 8,901,721 | B1 * | 12/2014 | Bai ...................... H01L 23/3107 257/666 |
| 9,190,351 | B2 | 11/2015 | Bai et al. |

\* cited by examiner

*Primary Examiner* — Luan C Thai
(74) *Attorney, Agent, or Firm* — Charles E. Bergere

(57) ABSTRACT

A lead frame for a packaged integrated circuit (IC) device has alternating first and second leads that protrude from a package body in respective first and second planes, where the second plane is parallel to and below the first plane. The first leads are formed into Gull Wing shaped leads and the second leads are formed into J-shaped leads. Inner lead portions of the first and second leads are maintained in the first plane with a tape. An inner lead portion of each of the second leads, proximate to and extending to the outer lead portion, is down-set, so that when the outer lead portion is pressed down by a mold tool to locate the outer lead portion of the second leads in the second plane, the inner lead portion of the second leads is maintained in the first plane and does not separate from the tape.

13 Claims, 4 Drawing Sheets

LEAD FRAME FOR INTEGRATED CIRCUIT DEVICE HAVING J-LEADS AND GULL WING LEADS

BACKGROUND

The present invention relates to integrated circuit (IC) packaging, and more particularly to a lead frame for an integrated circuit device having both J-leads and Gull Wing leads.

FIG. 1 is a side view of a portion of a semiconductor device 10 comprising a plastic body 12 that houses one or more integrated circuits, and a plurality of leads projecting from a side thereof, where two such leads 14 and 16 are shown. The plastic body 12 protects the integrated circuitry, while the leads allow for external electrical connection to the integrated circuitry. In order to allow adjacent leads to be located close together (i.e., to reduce lead pitch), and therefore have more leads spaced around the body 12, some of the leads, like the lead 14, are bent outward, and other ones of the leads are bent inward, like lead 16. The outward bending leads are known as Gull Wing leads and the inward bending leads are known as J-leads.

FIG. 2 is a top plan view of a lead frame 20 used to assemble the integrated circuit device 10 of FIG. 1. The lead frame 20 comprises a generally rectangular die pad 22 surrounded by a plurality of leads 24. As noted above, the leads 24 are very close to one another. To prevent the leads from bending or contacting with adjacent leads, tape 26 is placed over the leads to hold them in place. Referring again to FIG. 1, it can be seen that the Gull Wing leads 14 extend from the side of the package body 12 at a different plane than the J-leads 16. Referring now to FIG. 3, during a molding process in which the plastic body 12 is formed, a portion 30 of the mold tooling 30 presses on an outer lead portion close to an inner lead portion of the leads 24 that will be formed into J-leads 16 so that the Gull Wing leads 14 and the J-leads 16 will be vertically spaced from each other, while an outer area of the outer lead portion of the leads 24 is clamped with another portion 32 of the mold tooling. Unfortunately, this pressing and lead deformation can cause the tape 26 to separate from the leads 24, as shown in the lower half of FIG. 3. Accordingly, a minimum lead pitch requirement may be violated or worse yet, one of the J-leads 16 may contact an adjacent Gull Wing lead 14, causing an electrical short circuit. Accordingly, it would be advantageous to have a lead frame and/or a method of preventing such a rule violation or short circuit condition.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements.

DETAILED DESCRIPTION

Figure 2:
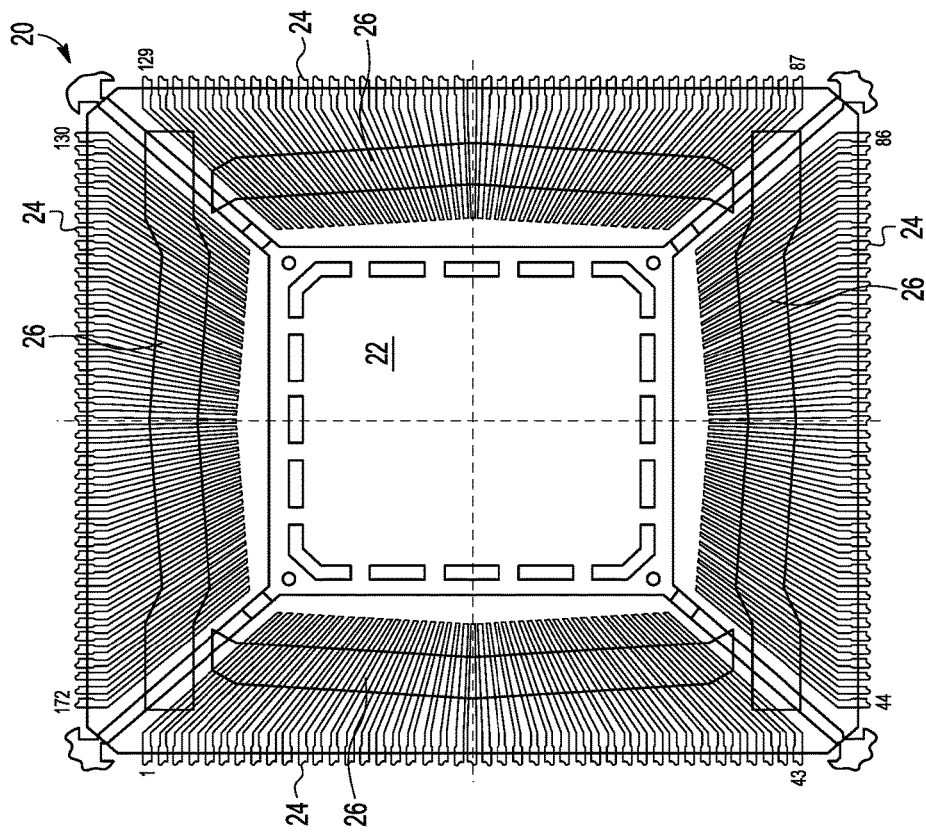
FIG. 2 is an enlarged top plan view of a lead frame of the conventional integrated circuit device of FIG. 1.
Figure 1:
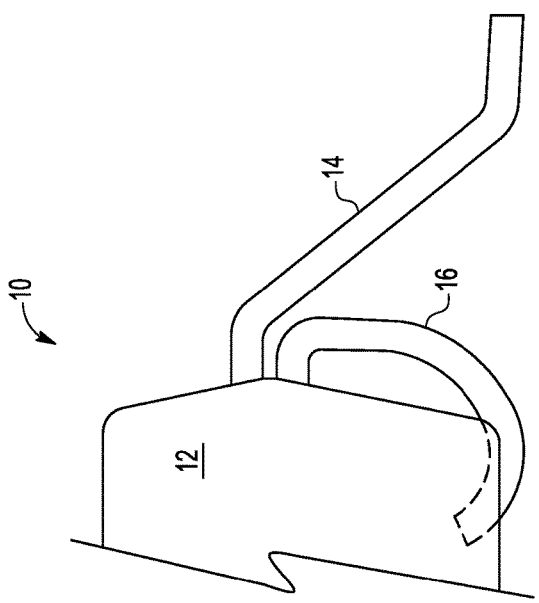
FIG. 1 is an enlarged side view of a portion of a conventional integrated circuit device that has both J-leads and Gull Wing leads.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

In one embodiment, the present invention provides an article of manufacture, which is a lead frame for assembling an integrated circuit device having both J-leads and Gull Wing leads. The lead frame comprises a central die receiving area configured for receiving at least one integrated circuit die, a plurality of first leads surrounding the die receiving area and extending outwardly therefrom in a first plane, and a plurality of second leads surrounding the die receiving area and extending outwardly therefrom in the first plane. The second leads are interleaved with the first leads. Each lead of the pluralities of first and second leads has a first inner lead area proximate to the die receiving area, a second inner lead area extending from the first inner lead area to a package boundary, and an outer lead area that extends beyond the package boundary. The first inner lead area is configured for electrical connection to bonding pads of the at least one integrated circuit die. Each of the second leads includes a down-set portion that extends from the second inner lead area to the outer lead area. The down-set portion facilitates maintaining the first inner lead area in the first plane when a force from a mold tool presses the outer lead area proximate to the inner lead areas downwards.

In another embodiment, the present invention comprises a packaged integrated circuit that includes the lead frame, an integrated circuit die attached to the die receiving area, a tape extending over a top surface of the first and second pluralities of leads at the second inner lead areas thereof, electrical connections connecting bonding pads of the die to the first and second pluralities of leads, and a mold compound that covers the die, the electrical connections, and the first and second inner lead areas. The tape maintains a spacing between adjacent leads, and also maintains the leads in the first plane. The outer lead area of the first plurality of leads is formed into a Gull Wing lead, and the outer lead area of the second plurality of leads is formed into a J-lead.

Figure 4:
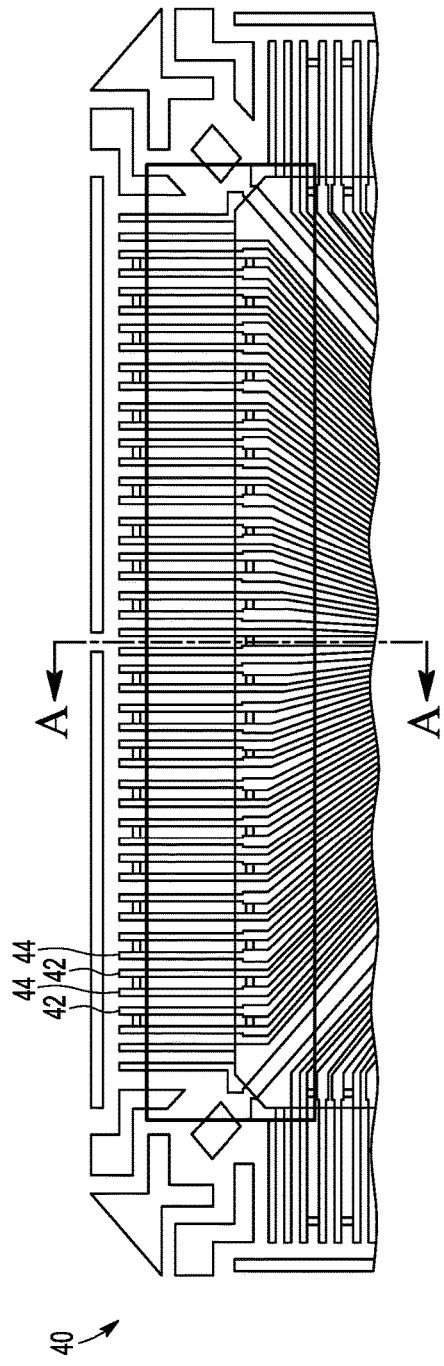
FIG. 4 is an enlarged top plan view of a portion of a lead frame in accordance with an embodiment of the present invention.

Referring now to FIG. 4, a top plan view of a portion of a lead frame 40 in accordance with one embodiment of the present invention is shown. The lead frame 40 is similar to the lead frame 20 shown in FIG. 2 in that it comprises a central die receiving area configured for receiving at least one integrated circuit die. The die receiving area is surrounded by first and second pluralities of leads 42 and 44, with the pluralities of leads being interleaved. In the presently preferred embodiment, the die receiving area comprises a die pad and the integrated circuit die has a bottom surface attached to the die pad. In one embodiment, the die receiving area has four sides and each side thereof has one fourth of the plurality of first and second leads 42 and 44 spaced from, but extending outwardly or away therefrom.

The lead frame 40 may be formed of copper or other conductive metals, as is known in the art, and may be supplied in either strip or array form. The lead frame 40 or just selected portions of the lead frame 40, like outer lead areas of the leads 42 and 44, may be coated or plated with another metal or alloy to inhibit corrosion when the lead frame is exposed to the ambient environment. The lead frame 40 may be formed from a sheet of copper or copper foil by cutting, stamping, and/or etching, as is known in the art.

Figure 5:
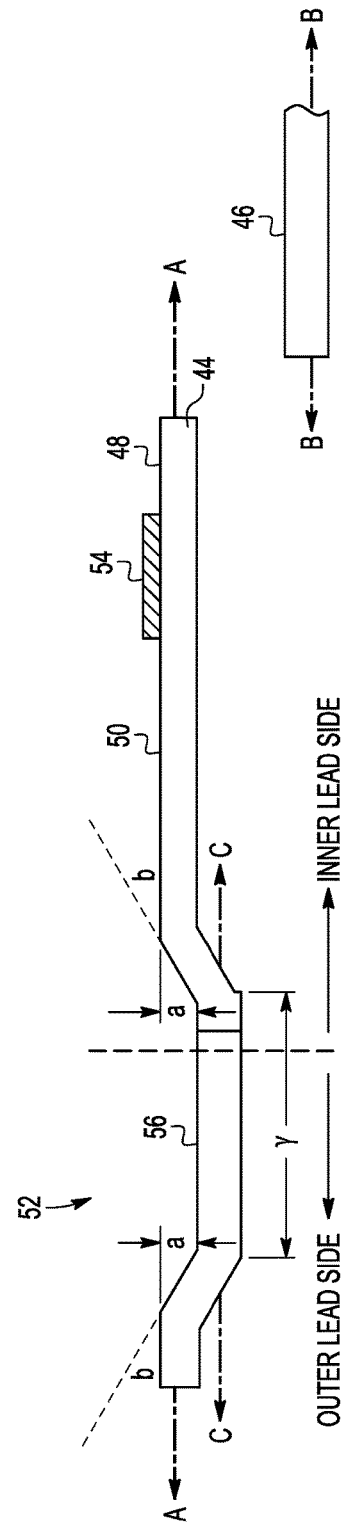
FIG. 5 is an enlarged side view of a J-lead of the lead frame of FIG. 4.

Referring now also to FIG. 5, FIG. 5 shows a side view of one of the second leads 44 of the plurality of second leads, as well as a portion of a die receiving area 46. FIG. 5 shows that the second leads 44 are spaced from and extend outwardly from the die receiving area 46, where the second leads 44 extend in a first plane A-A, and the die receiving area 46 lies in a second plane B-B that is parallel to and below the first plane A-A. In one embodiment, the die receiving area 46 comprises a die pad; that is, a solid piece of copper upon which a die is mounted. In some embodiments, the die pad may be made relatively thick so that it can act as a heat sink, moving heat generated by the die away from the die.

The second lead 44 has a first inner lead area 48 proximate to the die receiving area 46. The first inner lead area 48 is configured for electrical connection to I/O or bonding pads of the at least one integrated circuit die. The second lead 44 also has a second inner lead area 50 that extends from the first inner lead area 48 to a package boundary. The package boundary is indicated at the vertical dashed line, which also separates the inner lead areas from an outer lead area 52. The outer lead area 52 is that portion of the lead 44 that extends beyond the package boundary. The outer lead areas 52 allow for external connections to the integrated circuit die.

Figure 3:
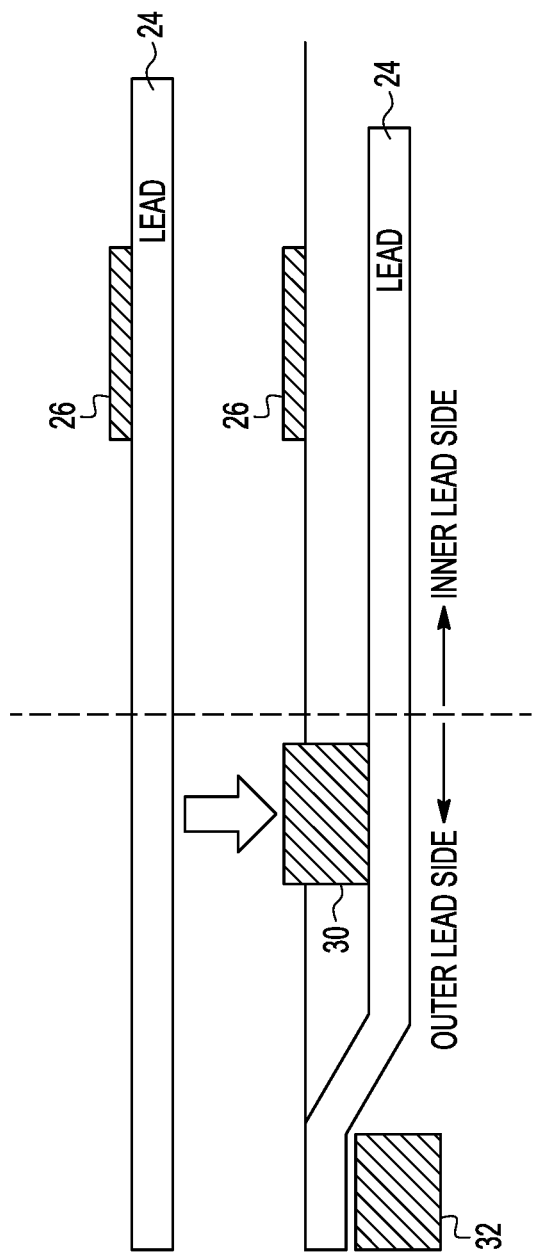
FIG. 3 is an enlarged side view of a lead of the lead frame of FIG. 2 during assembly of the conventional integrated circuit device of FIG. 1.

A tape 54 is placed over a top surface of the second inner lead areas 50 of the first and second pluralities of leads 42, 44. The purpose of the tape 54 is to maintain the first and second pluralities of leads in the first plane A-A, and to maintain a predetermined spacing between adjacent leads. In order to form a J-lead, the second leads 44 are pressed downward at the outer lead side when placed in a mold chase during a molding process. This downward force on the leads 44, in the prior art, can cause the leads to separate from the tape (see FIG. 3). The tape 56 may comprise a tape with a polyimide film and a silicone adhesive that has good strength and flexibility, and is heat resistant. Such tapes are known and commercially available.

Each of the second leads 44 also includes a down-set portion 56 that extends from the second inner lead area 50 to the outer lead area 52. The down-set portion 56 facilitates maintaining the first inner lead area 48 in the first plane A-A when the force from the mold tool presses the outer lead area 52 downwards. The mold tooling (shown in FIG. 3) is not shown in FIG. 5 in order to illustrate that the second leads 44 include the down-set portion 56 even before the lead frame 40 is placed into the mold. That is, the lead frame 40 is supplied with second leads 44 having the down-set portion 56. Because the second leads 44 include the down-set portion 56, when the lead frame 40 is placed in to the mold tool and the mold tooling presses down on the outer lead areas 52 of the second leads 44, the inner lead areas 48, 50 are less apt to separate from the tape 54 because the portion of the second lead 44 near the package outline already is down-set. The mold tooling presses on the second leads 44 so that the second leads 44 will exit and extend from the package body in a third plane C-C that is parallel to and below the plane A-A in which the first leads exit and extend from the package body. In one embodiment, the third plane C-C is below the first plane A-A and above the second plane B-B.

In one exemplary embodiment, the thickness of the lead frame 40 is about 0.127 mm. Then, the down-set portion 56 is formed to have a length of about 2.0 mm, an angle 'b' is about 45° plus or minus about 5°, and a pre-deformation amount 'a' is about 0.127 mm plus or minus about 0.025 mm.

Figure 6:
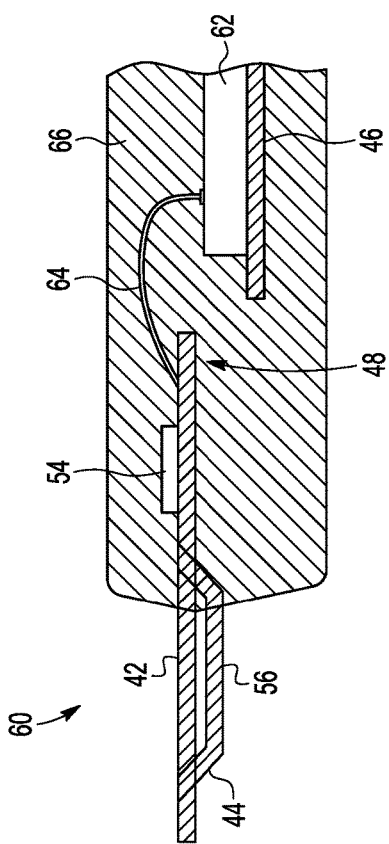
FIG. 6 is an enlarged side cross-sectional view of a portion of a packaged integrated circuit before a trim and form step in accordance with an embodiment of the present invention.

FIG. 6 is a cross-sectional side view of a portion of a packaged integrated circuit (IC) 60 in accordance with an embodiment of the present invention. The packaged IC 60 includes at least one integrated circuit die 62 attached to a top surface of the die pad 46, such as with a die attach adhesive. I/O or bonding pads of the die 62 are electrically connected with the first inner lead areas 48 of the first and second pluralities of leads, such as with bond wires 64. However, other interconnection methods are possible, such as having the leads 42 and 44 directly contact the die bonding pads.

A mold compound 66 covers the IC die 62, the plurality of interconnections or bond wires 64, and the inner lead areas 48 and 50 of the pluralities of first and second leads 42 and 44. The mold compound 66 defines a package body. The first and second leads 42 and 44 extend outwardly from the package body. As can be seen, proximate to the die receiving area 46, the first and second leads 42 and 44 lie in the same plane, while where the leads 42 and 44 extend from the package body, the second leads 44 lie in a plane that is parallel to and below the plane of the first leads 42 because the down-set portion 56 of the second leads 44 is the part of the leads 44 that extends from the package body.

Figure 7:
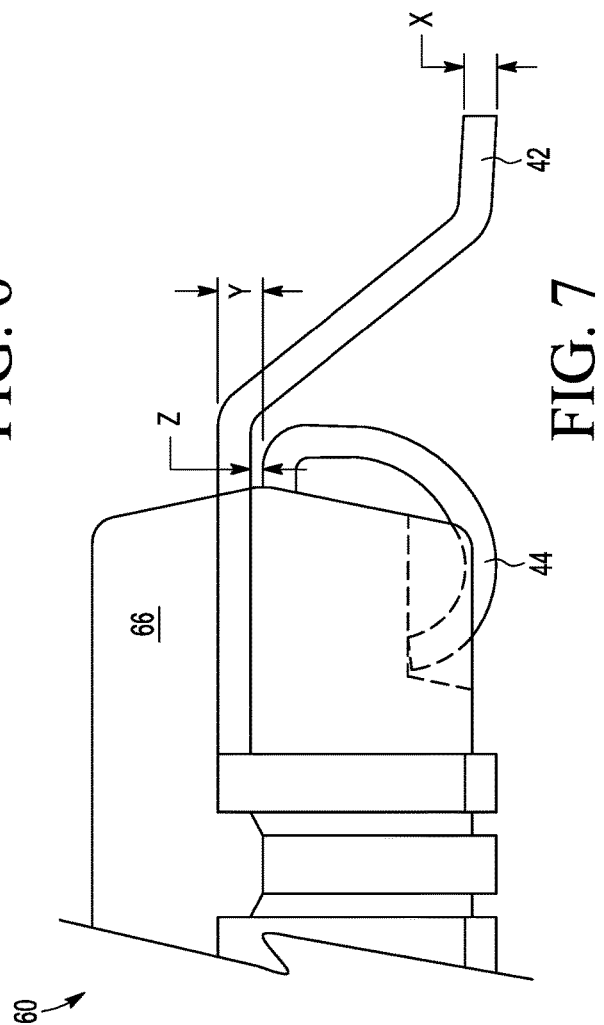
FIG. 7 is an enlarged side view of a portion of a packaged integrated circuit in accordance with an embodiment of the present invention.

FIG. 7 is an enlarged side view of a portion of the packaged IC 60 after the first leads 42 have been shaped into gull wing leads and the second leads 44 have been shaped into J-leads. The purpose of FIG. 7 is to illustrate the particulars of the down-set portion 56 of the second leads 44, in one embodiment of the present invention. The lead frame pre-form deformation (i.e., the down-set formation) is less than final package dimension, which allows for a small amount of deformation to occur during the molding process, which helps prevent the second lead 44 separating from the tape 54. Allowing for a small amount of deformation to occur during the molding process also is better for lead frame preheating, which is performed to mitigate burr issues in the molding process. Given a lead frame thickness of "x" and the distance between the gull wing lead 42 and the J-lead 44 to be "y", then the pre-deformation "a" (see FIG. 5) should be $x <= a <= y$. In one embodiment, $x = 0.127$ mm and $y = 0.177$ mm, so the pre-deformation amount 'a' is in the range of 0.127 to 0.177 mm.

It now should be apparent that the present invention comprises a lead frame for a dual row QFP, and a dual row QFP incorporating the lead frame. In the dual row QFP, every other lead is bent down and in to form a J-shape lead, while intervening leads are bent down and out into gull-wing shapes and, consequently, edges of adjacent leads that were in close proximity are separated. By including a down-set area in the leads that will be formed into J-leads, when the mold tooling presses on the lead to change the plane at which the lead extends from the package body, the down-set area ensures that the inner lead portion of the lead is not separated from the tape, and thus, the lead remains spaced from adjacent leads. Thus, while the inner lead portions of all of the leads (J-leads and gull-wing leads) lie in the same plane, the outer lead portions of the J-leads lie in plane that is parallel to and below the plane of the gull-wing leads. Maintaining the inner lead portions of all of the leads in the same plane facilitates wire bonding.

An embodiment of the invention has been described where the exposed portions of the leads have one or more bends in them to form j-shaped or gull-wing-shaped leads. In some alternative embodiments of the invention, the exposed portions have no bends in them and extend straight out from the case to form flat leads. An embodiment of the invention has been described where inner and outer leads alternate on all sides of an IC device. In some alternative embodiments of the embodiment, leads may be placed along some, but not all, sides of an IC device.

Embodiments of the invention have been described having particular dimensions defined. In alternative embodiments, the dimensions may vary beyond the described dimension ranges. It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

The invention claimed is:

1. An article of manufacture, comprising:
a central die receiving area configured for receiving at least one integrated circuit die;
a plurality of first leads surrounding the die receiving area and extending outwardly therefrom in a first plane;
a plurality of second leads surrounding the die receiving area and extending outwardly therefrom in the first plane,
wherein the plurality of second leads are interleaved with the plurality of first leads;
wherein each lead of the pluralities of first and second leads has a first inner lead area proximate to the die receiving area, said first inner lead area configured for electrical connection to bonding pads of the at least one integrated circuit die, a second inner lead area extending from the first inner lead area to a package boundary, and an outer lead area that extends beyond the package boundary; and
wherein each of the second leads includes a down-set portion that extends from the second inner lead area to the outer lead area, wherein the down-set portion facilitates maintaining the first inner lead area in the first plane when a force from a mold tool presses the outer lead area proximate to the inner lead areas downwards.

2. The article of manufacture of claim 1, further comprising a tape placed over a top surface of the second inner lead areas of the first and second pluralities of leads that maintains the first and second pluralities of leads in the first plane.

3. The article of manufacture of claim 2, wherein the down-set portion prevents the tape from separating from the second inner lead areas of the second leads.

4. The article of manufacture of claim 2, wherein the die receiving area comprises a die pad located in a second plane that is parallel to and below the first plane.

5. The article of manufacture of claim 4, further comprising an integrated circuit die having a bottom surface attached to the die pad.

6. The article of manufacture of claim 5, further comprising a plurality of interconnections that electrically connect bonding pads disposed on a top surface of the integrated circuit die with the inner lead areas of the first and second pluralities of leads.

7. The article of manufacture of claim 6, wherein the plurality of interconnections comprises bond wires.

8. The article of manufacture of claim 6, further comprising a mold compound that covers the integrated circuit die, the plurality of interconnections, and the inner lead areas of the pluralities of first and second leads, wherein the mold compound defines a package body.

9. The article of manufacture of claim 8, wherein the plurality of first leads extend outwardly from the package body in the first plane, and the plurality of second leads extend outwardly from the package body in a third plane that is parallel to and between the first and second planes.

10. The article of manufacture of claim 9, wherein the plurality of first leads are formed into a Gull Wing shape, and the plurality of second leads are formed into a J-lead shape.

11. The article of manufacture of claim 8, wherein:
the package body has four sides in a plan view;
each side of the package body has one fourth of the plurality of first leads extending therefrom; and
each side of the package body has one fourth of the plurality of second leads extending therefrom.

12. The article of manufacture of claim 1, wherein a thickness of the lead frame comprises 'x', a distance between the first and second leads is 'y', and a down-set 'a' of the down-set portion is in a range of x<a<y.

13. The article of manufacture of claim 12, wherein x is 0.127 mm and y=0.177 mm.

* * * * *